(12) United States Patent
Gibson (10) Patent No.: US 8,119,902 B2
(45) Date of Patent: Feb. 21, 2012

(54) CONCENTRATING MODULE AND METHOD OF MANUFACTURE FOR PHOTOVOLTAIC STRIPS

(75) Inventor: Kevin R. Gibson, Redwood City, CA (US)

(73) Assignee: Solaria Corporation, Fremont, CA (US)

( * ) Notice: Subject to any disclaimer, the term of this patent is extended or adjusted under 35 U.S.C. 154(b) by 557 days.

(21) Appl. No.: 12/121,788

(22) Filed: May 16, 2008

(65) Prior Publication Data

US 2008/0289689 A1    Nov. 27, 2008

Related U.S. Application Data

(60) Provisional application No. 60/939,089, filed on May 21, 2007.

(51) Int. Cl.
*H01L 31/042* (2006.01)
(52) U.S. Cl. ......... 136/246; 136/251; 136/259; 136/256
(58) Field of Classification Search .................. 136/246, 136/251, 256, 259
See application file for complete search history.

(56) References Cited

U.S. PATENT DOCUMENTS

| | | |
|---|---|---|
| 2,470,618 A | 5/1949 | Holden |
| 3,330,700 A | 7/1967 | Sequeira et al. |
| 3,446,676 A | 5/1969 | Goldsmith et al. |
| 3,575,721 A | 4/1971 | Mann |
| 3,597,050 A | 8/1971 | Plumat |
| 3,641,354 A | 2/1972 | De Ment |
| 3,700,714 A | 10/1972 | Hamilton et al. |
| 3,819,417 A | 6/1974 | Haynos |
| 3,849,880 A | 11/1974 | Haynos |
| 3,874,931 A | 4/1975 | Haynos |
| 3,951,633 A | 4/1976 | Danihel |
| 3,993,505 A | 11/1976 | Pack |
| 3,999,283 A | 12/1976 | Dean et al. |

(Continued)

FOREIGN PATENT DOCUMENTS

GB    1187969    4/1970

(Continued)

OTHER PUBLICATIONS

Citation for King et al. "Photovoltaic Module Performance and Durability Following Long-Term Field Exposure" Prog. Photovol: Res. And Appl., vol. 8, No. 2 pp. 241-256; May 23, 2000.

(Continued)

*Primary Examiner* — Basia Ridley
*Assistant Examiner* — Devina Pillay
(74) *Attorney, Agent, or Firm* — Richard T. Ogawa; Ogawa P.C.

(57) ABSTRACT

A glass concentrator for manufacture of solar energy conversion module is provided including a webbing that has a load sustenance characteristic and a hail impact resistance characteristic based on a first thickness of the webbing. The concentrator also includes a plurality of elongated concentrating elements integrally formed with the webbing. Each of the elongated concentrating elements has an aperture region, an exit region and two side regions, which bears a geometric concentration characteristic provided by a highly reflective side regions and an aperture-to-exit scale ratio in a range from about 1.8 to about 4.5. The glass concentrator can be attached with a plurality of photovoltaic strips cumulatively on each and every exit regions and clamped with a rigid or flexible back cover member to form a solar concentrator module for converting sunlight to electric energy. The solar concentrator module based on certain embodiments meets the industrial qualification standards.

11 Claims, 7 Drawing Sheets

U.S. PATENT DOCUMENTS

| | | |
|---|---|---|
| 4,029,519 A | 6/1977 | Schertz et al. |
| 4,056,405 A | 11/1977 | Varadi |
| 4,091,798 A | 5/1978 | Selcuk et al. |
| 4,097,308 A | 6/1978 | Klein et al. |
| 4,106,952 A | 8/1978 | Kravitz |
| 4,118,249 A | 10/1978 | Graven et al. |
| 4,122,833 A | 10/1978 | Selcuk et al. |
| 4,143,234 A | 3/1979 | Johnson et al. |
| 4,166,917 A | 9/1979 | Dorfeld et al. |
| 4,170,507 A | 10/1979 | Keeling et al. |
| 4,174,978 A | 11/1979 | Lidorenko et al. |
| 4,193,820 A | 3/1980 | Thomas |
| 4,203,646 A | 5/1980 | Desso |
| 4,239,555 A | 12/1980 | Scharlack et al. |
| 4,257,821 A | 3/1981 | Kelly et al. |
| 4,291,191 A | 9/1981 | Dahlberg |
| 4,293,192 A | 10/1981 | Bronstein |
| 4,295,463 A | 10/1981 | Citron |
| 4,333,447 A | 6/1982 | Lemrow et al. |
| 4,355,478 A | 10/1982 | Armstrong |
| 4,361,136 A | 11/1982 | Huang |
| 4,362,903 A | 12/1982 | Eichelberger et al. |
| 4,404,422 A | 9/1983 | Green et al. |
| 4,440,153 A | 4/1984 | Melchior |
| 4,449,514 A | 5/1984 | Selcuk |
| 4,454,371 A | 6/1984 | Folino |
| 4,457,297 A | 7/1984 | Sobczak et al. |
| 4,463,749 A | 8/1984 | Sobczak et al. |
| 4,495,360 A | 1/1985 | Anthony |
| 4,511,618 A | 4/1985 | Duchene et al. |
| 4,562,637 A | 1/1986 | Kushima et al. |
| 4,571,812 A | 2/1986 | Gee |
| 4,589,191 A | 5/1986 | Green et al. |
| 4,638,110 A | 1/1987 | Erbert |
| 4,663,562 A | 5/1987 | Miller et al. |
| 4,668,314 A | 5/1987 | Endoh et al. |
| 4,680,074 A | 7/1987 | Schmitz et al. |
| 4,683,154 A | 7/1987 | Benson et al. |
| 4,691,994 A | 9/1987 | Tveryanovich et al. |
| 4,692,557 A | 9/1987 | Samuelson et al. |
| 4,697,042 A | 9/1987 | Schilling |
| 4,711,972 A | 12/1987 | O'Neill |
| 4,830,038 A | 5/1989 | Anderson et al. |
| 4,848,319 A | 7/1989 | Appeldorn |
| 4,863,224 A | 9/1989 | Tveryanovich et al. |
| 4,953,577 A | 9/1990 | Marshall |
| 4,964,713 A | 10/1990 | Goetzberger |
| 4,999,059 A | 3/1991 | Bagno |
| 5,006,179 A | 4/1991 | Gaddy et al. |
| 5,011,544 A | 4/1991 | Gaddy et al. |
| 5,043,198 A | 8/1991 | Maruyama et al. |
| 5,080,725 A | 1/1992 | Green et al. |
| 5,118,361 A | 6/1992 | Fraas et al. |
| 5,153,780 A | 10/1992 | Jorgensen et al. |
| 5,158,618 A | 10/1992 | Rubin et al. |
| 5,167,724 A | 12/1992 | Chiang |
| 5,174,275 A | 12/1992 | Holland |
| 5,180,442 A | 1/1993 | Elias |
| 5,180,888 A | 1/1993 | Sugiyama et al. |
| 5,224,978 A | 7/1993 | Hermant et al. |
| 5,228,926 A | 7/1993 | Glatfelter et al. |
| 5,240,510 A | 8/1993 | Goldade et al. |
| 5,245,985 A | 9/1993 | Holland |
| 5,261,970 A | 11/1993 | Landis et al. |
| 5,344,496 A | 9/1994 | Stern et al. |
| 5,356,488 A | 10/1994 | Hezel |
| 5,365,920 A | 11/1994 | Lechner |
| 5,395,070 A | 3/1995 | Wilk et al. |
| 5,409,549 A | 4/1995 | Mori |
| 5,436,725 A | 7/1995 | Ledger |
| 5,449,626 A | 9/1995 | Hezel |
| 5,460,659 A | 10/1995 | Krut |
| 5,466,301 A | 11/1995 | Hammerbacher et al. |
| 5,468,304 A | 11/1995 | Hammerbacher et al. |
| 5,478,402 A | 12/1995 | Hanoka |
| 5,498,297 A | 3/1996 | O'Neill et al. |
| 5,508,205 A | 4/1996 | Dominguez et al. |
| 5,517,339 A | 5/1996 | Riccobono et al. |
| 5,529,054 A | 6/1996 | Shoen |
| 5,542,409 A | 8/1996 | Sampayo |
| 5,564,411 A | 10/1996 | Gerics et al. |
| 5,616,186 A | 4/1997 | Fraas et al. |
| 5,660,644 A | 8/1997 | Clemens |
| 5,707,459 A | 1/1998 | Itoyama et al. |
| 5,709,833 A | 1/1998 | Simone |
| 5,735,966 A | 4/1998 | Luch |
| 5,782,993 A | 7/1998 | Ponewash |
| 5,787,878 A | 8/1998 | Ratliff, Jr. |
| 5,790,304 A | 8/1998 | Sanders et al. |
| 5,840,147 A | 11/1998 | Grimm |
| 5,846,444 A | 12/1998 | Edwards et al. |
| 5,851,309 A | 12/1998 | Kousa |
| 5,865,905 A | 2/1999 | Clemens |
| 5,877,874 A | 3/1999 | Rosenberg |
| 5,882,434 A | 3/1999 | Horne |
| 5,915,170 A | 6/1999 | Raab et al. |
| 5,919,316 A | 7/1999 | Bogorad et al. |
| 5,936,777 A | 8/1999 | Dempewolf |
| 5,959,787 A | 9/1999 | Fairbanks |
| 5,964,216 A | 10/1999 | Hoffschmidt et al. |
| 6,008,449 A | 12/1999 | Cole |
| 6,020,553 A | 2/2000 | Yogev |
| 6,023,372 A * | 2/2000 | Spitzer et al. ................. 359/630 |
| 6,034,322 A | 3/2000 | Pollard |
| 6,049,035 A | 4/2000 | Tsuri et al. |
| 6,057,505 A | 5/2000 | Ortabasi |
| 6,074,614 A | 6/2000 | Hafeman et al. |
| 6,084,175 A | 7/2000 | Perry et al. |
| 6,091,017 A | 7/2000 | Stern |
| 6,091,020 A | 7/2000 | Fairbanks et al. |
| 6,092,392 A | 7/2000 | Verlinden et al. |
| 6,093,757 A | 7/2000 | Pern |
| 6,107,564 A | 8/2000 | Aguilera et al. |
| 6,118,067 A | 9/2000 | Lashley et al. |
| 6,134,784 A | 10/2000 | Carrie et al. |
| 6,150,602 A | 11/2000 | Campbell |
| 6,167,724 B1 | 1/2001 | Pozivil |
| 6,242,685 B1 | 6/2001 | Mizukami et al. |
| 6,252,155 B1 | 6/2001 | Ortabasi |
| 6,264,510 B1 | 7/2001 | Onizuka |
| 6,274,402 B1 | 8/2001 | Verlinden et al. |
| 6,274,860 B1 | 8/2001 | Rosenberg |
| 6,293,803 B1 | 9/2001 | Rust et al. |
| 6,294,723 B2 | 9/2001 | Uematsu et al. |
| 6,309,901 B1 | 10/2001 | Tahon et al. |
| 6,313,395 B1 | 11/2001 | Crane et al. |
| 6,315,575 B1 | 11/2001 | Kajimoto |
| 6,320,116 B1 | 11/2001 | Hanoka |
| 6,323,415 B1 | 11/2001 | Uematsu et al. |
| 6,333,457 B1 | 12/2001 | Mulligan et al. |
| 6,333,458 B1 | 12/2001 | Forrest et al. |
| 6,337,283 B1 | 1/2002 | Verlinden et al. |
| 6,359,209 B1 | 3/2002 | Glenn et al. |
| 6,365,823 B1 | 4/2002 | Kondo |
| 6,387,726 B1 | 5/2002 | Verlinden et al. |
| 6,395,972 B1 | 5/2002 | Tran et al. |
| 6,423,568 B1 | 7/2002 | Verlinden et al. |
| 6,429,037 B1 | 8/2002 | Wenham et al. |
| 6,433,913 B1 | 8/2002 | Bauer et al. |
| 6,437,236 B2 | 8/2002 | Watanabe et al. |
| 6,440,769 B2 | 8/2002 | Peumans et al. |
| 6,441,297 B1 | 8/2002 | Keller |
| 6,479,744 B1 | 11/2002 | Tsuzuki et al. |
| 6,528,716 B2 | 3/2003 | Collette et al. |
| 6,528,718 B2 | 3/2003 | Yoda et al. |
| 6,609,836 B1 | 8/2003 | Antonelli et al. |
| 6,612,705 B1 | 9/2003 | Davidson et al. |
| 6,617,505 B2 | 9/2003 | Shimada |
| 6,619,282 B1 | 9/2003 | Murtha |
| 6,620,995 B2 | 9/2003 | Vasylyev et al. |
| 6,639,733 B2 | 10/2003 | Minano et al. |
| 6,641,868 B2 | 11/2003 | Abe et al. |
| 6,666,207 B1 | 12/2003 | Arkas et al. |
| 6,676,263 B2 | 1/2004 | Winston |
| 6,700,054 B2 | 3/2004 | Cherney et al. |
| 6,700,055 B2 | 3/2004 | Barone |
| 6,758,609 B2 | 7/2004 | Fathi et al. |

| | | |
|---|---|---|
| 6,761,598 B2 | 7/2004 | Onizuka et al. |
| 6,804,062 B2 | 10/2004 | Atwater et al. |
| 6,809,250 B2 | 10/2004 | Gerson |
| 6,815,070 B1 | 11/2004 | Burkle et al. |
| 6,822,157 B2 | 11/2004 | Fujioka |
| 6,825,052 B2 | 11/2004 | Eldridge et al. |
| 6,829,908 B2 | 12/2004 | Bowden et al. |
| 6,843,573 B2 | 1/2005 | Rabinowitz et al. |
| 6,849,797 B2 | 2/2005 | Koyanagi et al. |
| 6,903,261 B2 | 6/2005 | Habraken et al. |
| 6,958,868 B1 | 10/2005 | Pender |
| 7,019,207 B2 | 3/2006 | Harneit et al. |
| 7,055,519 B2 | 6/2006 | Litwin |
| 7,071,134 B2 | 7/2006 | Koyama et al. |
| 7,144,598 B2 | 12/2006 | Moravec et al. |
| 7,156,666 B2 | 1/2007 | Mann |
| 7,190,110 B2 | 3/2007 | Tokai et al. |
| 7,250,209 B2 | 7/2007 | Shibahara et al. |
| 7,282,240 B1 | 10/2007 | Jackman et al. |
| 7,309,831 B2 | 12/2007 | Yamada |
| 7,423,083 B2 | 9/2008 | Kawaguchi et al. |
| 7,595,543 B2 | 9/2009 | Weber et al. |
| 2002/0007845 A1 | 1/2002 | Collette et al. |
| 2002/0018308 A1 | 2/2002 | Winston |
| 2002/0075579 A1 | 6/2002 | Vasylyev et al. |
| 2002/0139414 A1 | 10/2002 | Vasylyev et al. |
| 2003/0015233 A1 | 1/2003 | Barone |
| 2003/0016539 A1 | 1/2003 | Minano et al. |
| 2003/0021897 A1 | 1/2003 | Abe et al. |
| 2003/0037569 A1 | 2/2003 | Arbab et al. |
| 2003/0037814 A1 | 2/2003 | Cohen et al. |
| 2003/0074976 A1 | 4/2003 | Ahmad |
| 2003/0081333 A1 | 5/2003 | Winston |
| 2003/0095340 A1 | 5/2003 | Atwater et al. |
| 2003/0121542 A1 | 7/2003 | Harneit et al. |
| 2003/0156337 A1 | 8/2003 | Davidson et al. |
| 2003/0201007 A1 | 10/2003 | Fraas et al. |
| 2003/0228114 A1 | 12/2003 | Fathi et al. |
| 2003/0228417 A1 | 12/2003 | Nishikawa et al. |
| 2004/0004216 A1 | 1/2004 | Eldridge et al. |
| 2004/0016454 A1 | 1/2004 | Murphy et al. |
| 2004/0021964 A1 | 2/2004 | Rabinowitz et al. |
| 2004/0084077 A1 | 5/2004 | Aylaian |
| 2004/0092668 A1 | 5/2004 | Kawaguchi et al. |
| 2004/0097012 A1 | 5/2004 | Weber et al. |
| 2004/0108813 A1 | 6/2004 | Tokai et al. |
| 2004/0123895 A1 | 7/2004 | Kardauskas et al. |
| 2004/0134531 A1 | 7/2004 | Habraken et al. |
| 2004/0194820 A1 | 10/2004 | Barone |
| 2004/0229394 A1 | 11/2004 | Yamada et al. |
| 2004/0243364 A1 | 12/2004 | Wendelin et al. |
| 2004/0246605 A1 | 12/2004 | Stiles et al. |
| 2005/0070059 A1 | 3/2005 | Blakers et al. |
| 2005/0081908 A1 | 4/2005 | Stewart |
| 2005/0081909 A1 | 4/2005 | Paull |
| 2005/0087294 A1 | 4/2005 | Rabinowitz |
| 2006/0054211 A1 | 3/2006 | Meyers |
| 2006/0207646 A1 | 9/2006 | Terreau et al. |
| 2006/0235717 A1 | 10/2006 | Sharma et al. |
| 2006/0266406 A1 | 11/2006 | Faust et al. |
| 2006/0272698 A1 | 12/2006 | Durvasula |
| 2006/0283495 A1 | 12/2006 | Gibson |
| 2007/0056626 A1 | 3/2007 | Funcell |
| 2007/0095386 A1 | 5/2007 | Gibson |
| 2007/0153354 A1 | 7/2007 | Duston et al. |
| 2007/0251568 A1 | 11/2007 | Maeda |
| 2008/0060696 A1 | 3/2008 | Ho et al. |
| 2008/0197376 A1 | 8/2008 | Bert et al. |
| 2008/0236655 A1 | 10/2008 | Baldwin et al. |
| 2008/0236664 A1 | 10/2008 | Gibson et al. |
| 2008/0236740 A1 | 10/2008 | Gibson et al. |
| 2008/0241479 A1 | 10/2008 | Nghiem et al. |
| 2008/0314438 A1 | 12/2008 | Tran et al. |

FOREIGN PATENT DOCUMENTS

| | | | |
|---|---|---|---|
| JP | 61-044741 A | | 3/1986 |
| WO | WO 2006/015430 A1 | | 2/2006 |
| WO | WO 2006/089540 A2 | | 8/2006 |
| WO | WO 2006/133126 A2 | | 12/2006 |

OTHER PUBLICATIONS

King et al. "Photovoltaic Module Performance and Durability Following Long-Term Field Exposure" Prog. Photovol: Res. And Appl., vol. 8, No. 2 pp. 241-256; May 23, 2000.
PCT Search Report and PCT Written Opinion of Application No. PCT/US08/64132, date of mailing Aug. 15, 2008, 10 pages total.
ACLAR Fluropolymer Film by SPI Supplies, http://web.archive.org/web/20021022180352/http://www.2spi.com/catalog/photo/acalr-film.shtml, 3 pages.
Andreev et al., "Concentrator PV Modules of "All-Glass" Design With Modified Structure;" Paper 3P-C3-72 presented at WCPEC-3, Osaka Japan; May 11-18, 2003; 4 pages.
Boedeker Plastics, Inc.: Acrylic Polymethyl-MethAcrylate PMMA datasheet, http://www.boedeker.com/acryl.html; May 7, 1999; pp. 1-2.
Breeze, A.J., et al., "Improving power efficiencies in polymer—polymer blend photvoltaics", Solar Energy Materials & Solar Cells, 83, 2004, pp. 263-271.
"3M Glass Bubbles", Product Catalogue for 3M Energy and Advance Materials, Feb. 18, 2009, pp. 1-3.
Emissivity Values for Common Materials, http://www.infrared-thermography.com/ materials-1.htm, retrieved on Apr. 2, 2010, 4 pages.
Marayuma, T., et al. "Wedge-shaped light concentrator using total internal reflection", Solar Energy Materials & Solar Cells, 57, (1999), pp. 75-83.
Nitto Denko, Web page: http://www.nitto.com/ product/datasheet/037/index.html as updated on Apr. 18, 2005 from Internet Archive, 2 pages.
Pern et al, "Photothermal Stability of an E-Beam Pre-Crosslinked EVA Encapsulant and Its Performance Degradation on a-Si Submodules", NREL/CP-520-31026, Oct. 2001, Lakewood, Colorado, 4 pages.
Petrie, "Additives in Radiation (EB/UV) Cured Adhesive Formulations" www.specialchem4adhesives.com, Oct. 14, 2002, 6 pages.
Photovoltaic/Solar Panel Laminations; MADICO, http://www.madico.com/specialty_pv.asp; Jun. 11, 2007; pp. 1-2.
Wells, G.M., et al. "Effects of mirror surface roughness on exposure field uniformity in synchrontron x-ray lithography", American Vacuum Society, J. Vac. Sci. Technol., 1991, pp. 3227-3231.
International Search Report and Written Opinion for PCT Patent Application No. PCT/US2010/024943, mailed Apr. 22, 2010, 9 pages.
International Search Report and Written Opinion for PCT Patent Application No. PCT/US2008/71127, mailed Oct. 22, 2008, 9 pages.
International Search Report and Written Opinion for PCT Patent Application No. PCT/US2008/059170 mailed Aug. 6, 2008, 8 pages.
International Search Report and Written Opinion for PCT Patent Application No. PCT/US2008/075134 mailed Dec. 5, 2008, 9 pages.
International Search Report and Written Opinion for PCT Application No. PCT/US2008/59167, mailed Dec. 8, 2008, 11 pages.
International Search Report and Written Opinion for PCT Patent Application No. PCT/US2006/35793, mailed May 10, 2007, 8 pages.
International Search Report and Written Opinion of PCT Patent Application No. PCT/US2006/29164, mailed Jun. 5, 2008, 15 pages.
International Search Report and Written Opinion for PCT Patent Application No. PCT/US2006/21803, dated Aug. 30, 2007, 21 pages.
Office Action for Chinese Patent Application No. 200680026582.4, mailed May 27, 2010, 14 pages.
Office Action for U.S. Appl. No. 11/445,933 dated Apr. 14, 2010, 7 pages.
Office Action for U.S. Appl. No. 11/445,933 dated Oct. 14, 2009, 8 pages.
Office Action for U.S. Appl. No. 11/445,948 dated Apr. 15, 2010, 27 pages.
Office Action for U.S. Appl. No. 11/445,948 dated May 22, 2009, 18 pages.
Office Action for U.S. Appl. No. 11/354,530 dated Jan. 6, 2010, 7 pages.
Office Action for U.S. Appl. No. 11/493,380 dated Jul. 22, 2009, 22 pages.

Office Action for U.S. Appl. No. 11/493,380 dated Feb. 17, 2009, 24 pages.
Office Action for U.S. Appl. No. 11/493,380 dated May 30, 2008, 25 pages.
Office Action for U.S. Appl. No. 12/136,572 dated Feb. 4, 2010, 15 pages.
Office Action for U.S. Appl. No. 12/136,574 dated Jan. 12, 2010, 15 pages.
Office Action for U.S. Appl. No. 12/136,574 dated Jun. 8, 2009, 10 pages.
Office Action for U.S. Appl. No. 12/136,574 dated Dec. 29, 2008, 9 pages.
Office Action for U.S. Appl. No. 12/136,577 dated Jun. 8, 2009, 12 pages.
Office Action for U.S. Appl. No. 12/136,581 dated Feb. 4, 2010, 13 pages.
Office Action for U.S. Appl. No. 11/402,490 dated Oct. 30, 2009, 12 pages.
Office Action for U.S. Appl. No. 11/402,490 dated Mar. 3, 2009, 18 pages.
Office Action for U.S. Appl. No. 12/167,198 dated Dec. 19, 2008, 15 pages.
Office Action for U.S. Appl. No. 11/254,114 dated Feb. 2, 2010, 10 pages.
Office Action for U.S. Appl. No. 11/253,182 dated Feb. 5, 2010, 6 pages.
Office Action for U.S. Appl. No. 11/253,182 dated Jan. 8, 2009, 14 pages.
Office Action for U.S. Appl. No. 11/252,425 dated Oct. 16, 2009, 6 pages.
Office Action for U.S. Appl. No. 11/252,425 dated Mar. 19, 2009, 6 pages.
Office Action for U.S. Appl. No. 11/252,425 dated Jul. 9, 2008, 15 pages.
Office Action for U.S. Appl. No. 11/253,418 dated Sep. 11, 2009, 19 pages.
Office Action for U.S. Appl. No. 11/253,202 dated Aug. 31, 2009, 19 pages.
Office Action for U.S. Appl. No. 11/253,202 dated Feb. 19, 2009, 22 pages.
Office Action for U.S. Appl. No. 11/252,399 dated Dec. 4, 2009, 22 pages.
Office Action for U.S. Appl. No. 11/252,399 dated Jun. 2, 2009, 17 pages.
Office Action for U.S. Appl. No. 11/252,399 dated Aug. 20, 2008, 16 pages.
Office Action for U.S. Appl. No. 11/254,041 dated Jan. 26, 2010, 8 pages.
Office Action for U.S. Appl. No. 11/290,313 dated Apr. 15, 2010, 10 pages.
Office Action for U.S. Appl. No. 11/290,313 dated Sep. 21, 2009, 7 pages.
Office Action for U.S. Appl. No. 11/753,546 dated Mar. 31, 2010, 10 pages.
Office Action for U.S. Appl. No. 12/060,801 dated Apr. 13, 2010, 24 pages.
Office Action for U.S. Appl. No. 12/332,340 dated Apr. 26, 2010, 17 pages.
Office Action for U.S. Appl. No. 11/841,899 of Mar. 11, 2008, 18 pages.

* cited by examiner

CONCENTRATING MODULE AND METHOD OF MANUFACTURE FOR PHOTOVOLTAIC STRIPS

CROSS-REFERENCES TO RELATED APPLICATIONS

This application claims priority of U.S. Patent Application No. 60/939,089, and titled "CONCENTRATING MODULE AND METHOD OF MANUFACTURE FOR PHOTOVOL- TAIC STRIPS," filed by Kevin R. Gibson at May 21, 2007 commonly assigned, and is incorporated by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to solar energy techniques. In particular, the present invention provides a method and resulting device for manufacturing the solar energy conversion system. More particularly, the present invention provides a method and a structure for manufacture of a sunlight concentrator module having a glass webbing integrally including a plurality of concentrating elements coupled with a plurality of photovoltaic strips. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and resulting device for manufacturing the solar energy conversion system. More particularly, the present invention provides a method and a structure for manufacture of a sunlight concentrator module having a glass webbing integrally including a plurality of concentrating elements coupled with a plurality of photovoltaic strips. Merely by way of example, the invention has been applied to solar panels, commonly termed modules, but it would be recognized that the invention has a much broader range of applicability.

In a specific embodiment, the present invention provides a concentrator for manufacture of solar energy conversion module. The concentrator includes a webbing having a shape characterized by a first dimension, a second dimension, and a planar region defined by the first dimension and the second dimension. The webbing has a front region, a back region, and a first thickness provided between the front region and the back region. Additionally, the concentrator includes a load sustenance characteristic from the first thickness of the webbing. The load is at least of 2400 Pa uniformly applied on the front region for 1 hour in two cycles. The concentrator further includes a hail impact resistance characteristic of the webbing. The impact hail is an ice ball with at least of 25 mm diameter directed at a speed of at least 23 meter per second to at least 11 locations of the front region. Moreover, the concentrator includes a plurality of elongated concentrating elements integrally formed with the back region one-next-to-another in parallel along the first dimension. Each of the elongated concentrating elements having a length, an aperture region, an exit region, a first side region provided between a first portion of the aperture region and a first portion of the exit region, a second side region provided between a second portion of the aperture region and a second portion of the exit region, and a second thickness provided between the aperture region and the exit region. The length of the concentrating element is substantially the same as the second dimension. The concentrator further includes a geometric optical concentration characteristic provided by a scale ratio of the aperture region to the exit region for each of the plurality of elongated concentrating elements. The scale ratio is characterized by a range from about 1.8 to about 4.5. Furthermore, the concentrator includes an optical transparency characteristic of the first thickness of the webbing combined with the second thickness of each of the plurality of concentrating elements with a transmissivity being at least of 90 percent and greater within a visible light range. Of course, there can be other variations, modifications, and alternatives. For example, the webbing can be a glass or a plastic.

In an alternative specific embodiment, the invention provides a sunlight concentrator module for manufacture of solar energy conversion system. The solar concentrator module including a webbing having a shape characterized by a first dimension, a second dimension, a planar region defined by the first dimension and the second dimension. The webbing has a front region, a back region, and a first thickness of about 3 mm to about 9 mm measured between the front region and the back region. Additionally, the module includes a load sustenance characteristic provided by the first thickness of the webbing. The load is at least of 2400 Pa uniformly applied on the front region for 1 hour in two cycles. The module further includes a hail impact resistance characteristic of the webbing with the first thickness. The impact hail can be an ice ball with at least of 25 mm diameter directed at a speed of at least 23 meter per second to at least 11 locations of the front region. Moreover, the module includes a plurality of concentrator elements integrally formed with the back region excluding a peripheral region of the webbing. Each of the concentrator elements is disposed one-next-to-another in parallel along the first dimension and characterized by a length, an aperture region, an exit region, a first side region provided between a first portion of the aperture region and a first portion of the exit region, a second side region provided between a second portion of the aperture region and a second portion of the exit region, and a second thickness of about 1.8 mm provided between the aperture region and the exit region. The length of the concentrating element is substantially the same as the second dimension. The module also includes a geometric concentration characteristic provided by a scale ratio of the aperture region to the exit region for each of the plurality of concentrator elements. The scale ratio is in a range from about 1.8 to about 4.5. The module further includes an optical transparency characteristic of the first thickness of the webbing combined with the second thickness of each of the plurality of concentrating elements with a transmissivity being at least of 90 percent and greater within a visible light range. The module still includes a plurality of photovoltaic strips. Each of the plurality of photovoltaic strips is coupled to at least a portion of each of the exit region of the plurality of concentrator elements. Each photovoltaic strip has a width substantially similar to the exit region. One or more photovoltaic strips have a cumulative length substantially similar to the length of the concentrator element. Furthermore, the module includes a plurality of electric conducting leads disposed along two edges of each of the plurality of photovoltaic strips. Each of the plurality of conducting leads is conductively connected to each other and to module external electrical ports. The module further includes either a rigid back cover or a flexible backsheet configured to mechanically couple with the webbing at the peripheral region.

In yet still an alternative embodiment, the present invention includes a method of making a glass concentrator for manufacture of solar energy conversion module. The method includes forming molten glass. The method then includes feeding a predetermined amount of the molten glass into a float bath to form a floating ribbon glass in rectangular shape defined by a first dimension and a second dimension, and processing the floating ribbon glass to have an even first thickness between a top surface and a back surface. Additionally, the method includes rolling with a shaped molding roller across the top surface partially into the first thickness of the floating ribbon glass at a predetermined first temperature within a first time period to form a plurality of shaped concentrating elements with a second thickness. The method further includes annealing the ribbon glass by gradually reducing temperature from the first temperature to a second temperature within a second time period. The method further includes lifting the ribbon glass at the second temperature onto a plurality of circular rollers and rolling the back surface while continuing cool the ribbon glass to a third temperature during transportation on the plurality of circular rollers. The method also includes flame polishing the plurality of shaped concentrating elements on the top surface.

In a further alternative embodiment, the invention also provides a method of making a glass concentrator for manufacture of solar energy conversion module. The method includes forming a ribbon glass characterized by a first thickness between a top surface and a back surface. The method further includes rolling with a shaped molding roller across the top surface partially into the first thickness of the ribbon glass at a first temperature within a first time period to form a plurality of shaped structures with a second thickness. Additionally, the method includes polishing at least partially the plurality of shaped structures on the top surface. In one embodiment, the first thickness comprises a characteristic of sustaining at least a load of 2400 Pa uniformly applied for 1 hour in two cycles. In another embodiment, the plurality of shaped structures comprises a plurality of concentrating elements one-next-to-another in parallel. Each of the plurality of concentrating elements comprises two reflective side surfaces and a scale ratio of an aperture region to an exit region being about 2.0 and greater. In yet another embodiment, the two reflective side surfaces are polished with a root-mean-square roughness equal to 30 nm or less.

Still further, the present invention provides a method of assembling a solar concentrator module. The method includes preparing a glass concentrator including a webbing. The webbing has a flat front plane and a back plane occupied entirely by a plurality of elongated concentrating elements excluding a peripheral region. Each of the plurality of elongated concentrating elements has a light-collecting exit region. Additionally, the method including providing an optical coupling material overlaying each light-collecting exit region. The method further includes providing a plurality of photovoltaic strips. Each of the plurality of photovoltaic strips has two short sides and two long edges. The two short sides have comparable dimensions as the light-collecting exit region. The two long edges include a plurality of electric leads that are inter-connected. Moreover, the method includes bonding the plurality of photovoltaic strips using at least the optical coupling material individually and cumulatively to each and every light-collecting exit region. The method further includes providing a back cover member comprising a circuit board electrically coupled with the plurality of electric leads. The back cover member has a shape substantially matched with the webbing and an integral uprising edge wall. Furthermore, the method includes clamping the edge wall with the glass concentrator at the peripheral region of the webbing. Alternatively, a flexible backsheet can be used in place of a rigid back cover.

Many benefits are achieved by way of the present invention over conventional techniques. For example, the present technique provides an easy to use process that relies on conventional technology such as silicon materials in the photovoltaic strips, although other materials also can be used. Additionally, the method provides a process that is compatible with conventional process technology without substantial modifications to conventional equipment and processes. Preferably, the invention provides for an improved solar module, which is less costly and easy to handle. Such solar module uses a single piece of glass webbing integrally including a plurality of concentrating elements for coupling with a plurality of photovoltaic strips, which are packaged by coupling a rigid back cover member around a peripheral region. In a preferred embodiment, the invention provides a glass concentrator having a characteristic from the thickness of the glass webbing to sustain a load of at least 2400 Pa uniformly applied on the webbing surface for 1 hour in two cycles. Also in a preferred embodiment, the invention provides a glass concentrator having a geometric concentration characteristic with an aperture-to-exit scale ratio in a range from about 1.8 to about 4.5 and polished side regions with RMS roughness less than 30 nm. The use of concentrator according to the present invention helps the solar conversion module having less photovoltaic material per surface area (e.g., 80% or less, 50% or less) than conventional solar panel module. In another preferred embodiment, the invention provides a sunlight concentrator module packaged with a plurality of concentrating elements integrally formed with the glass webbing and coupled with a plurality of photovoltaic strips with improved total conversion efficiency. In still a preferred embodiment, the invention provides a conducting leads design reducing non-solar-conversion area within the assembly to enhance the packing factor to 90% or greater. In one embodiment, the invention provides a solar concentrator module with a glass webbing as a top cover sealed with a rigid back cover or a flexible backsheet around the peripheral region. In another embodiment, the invention provides a solar concentrator module with a glass webbing as a top cover assembled with a rigid back cover or a flexible backsheet that is not sealed so as to allow trapped water vapor breathing out of the photovoltaic region. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to solar energy techniques. In particular, the present invention provides a method and resulting device for manufacturing the solar energy conversion system. More particularly, the present invention provides a method and a structure for manufacture of a sunlight concentrator module having a glass webbing integrally including a plurality of concentrating elements coupled with a plurality of photovoltaic strips. Merely by way of example, the invention has been applied to solar panels, commonly termed modules, but it would be recognized that the invention has a much broader range of applicability.

Figure 1:
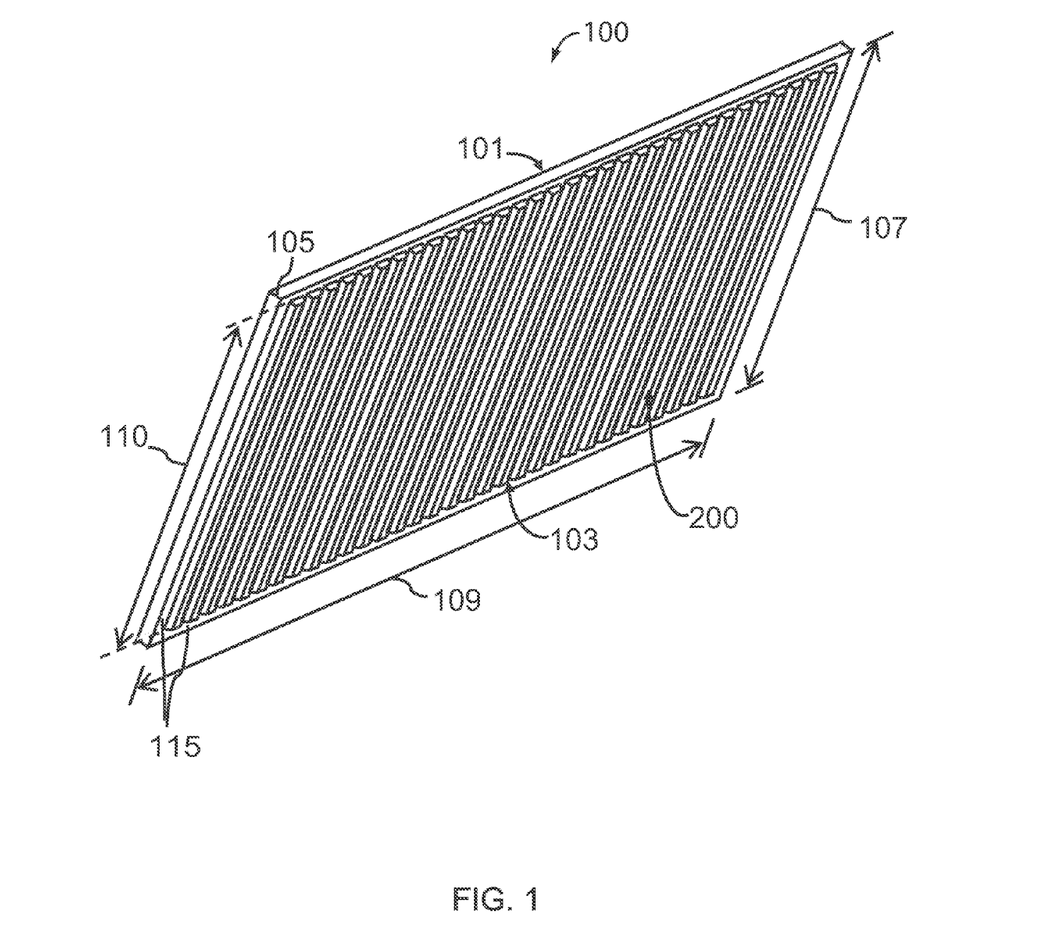
FIG. 1 is a simplified diagram illustrating a perspective view of a glass concentrator for a solar concentrator module according to an embodiment of the present invention.

FIG. 1 is a simplified diagram illustrating a glass concentrator for a solar concentrator module according to an embodiment of the present invention. This diagram is merely an example, which should not unduly limit the scope of the claims herein. One of ordinary skill in the art would recognize other variations, modifications, and alternatives. As shown is a perspective view of a glass concentrator, which is a light concentrator including a webbing and a plurality of concentrating elements. The concentrator 100 has a webbing with a top region 101 (not directly seen), back region 103, a first thickness 105 defined between the top region and the back region, a first dimension 107, and a second dimension 109. Additionally, a plurality of elongated concentrating elements 200 is formed integrally with the back region 103 of the webbing as part of a single piece of glass. In one embodiment, each of the plurality of elongated concentrating elements has a length 110 and is disposed one-next-to-another in parallel extending from one side portion of the webbing to another side of the webbing. In a specific embodiment, the elongated concentrating element is parallel to the side of webbing with the first dimension. In another specific embodiment, the elongated concentrating element is parallel to the side of webbing with the second dimension. In yet another embodiment, the plurality of concentrating elements 200 occupies the entire area of the back region 103 excluding a peripheral region 115. Of course, there can be other variations, modifications, and alternatives. The detail structures of the elongated concentrating element will be described in specification below.

In a preferred embodiment, the webbing and the plurality of concentrating elements are made of a single piece of glass. For example, this piece of glass comprises mixed batch materials of sand, limestone, cerium oxide, iron oxide and salt cake. In one embodiment, the glass comprises a concentration of iron content about a trace amount and less. In another embodiment, the glass has cerium oxide at a concentration of about a trace amount and less, or non-existent. In another preferred embodiment, the glass is a tempered glass, processed to meet safety standard enforced by general construction codes. Of course, there can be other variations, modifications, and alternatives.

According to another embodiment of the present invention, the concentrator as shown in FIG. 1 is directly used for manufacture a solar concentrator module. In particular, the concentrator has a rectangular shape easy for manufacture and use. The rectangular shape is characterized by the first dimension 107 and the second dimension 109. In one embodiment, the first dimension 107 is selected to be about 1 meter or bigger and the second dimension is correspondingly selected to be about 1.6 meters or bigger. In another embodiment, with such a size selected above, the peripheral region 115 of about 10 mm in dimension is selected for clamping or other packaging purpose. Of course, there can be other variations, modifications, and alternatives for the dimensions selected for the concentrator.

As a preferred embodiment of the present invention, the concentrator 100 will be directly used as a light receiving top cover member for the solar conversion module. In order to satisfy the industry qualification standard regarding to module's mechanical toughness, the first thickness 105 between the top region and the back region is selected to be at least 3.2 mm according to an embodiment of the present invention. For example, the first thickness can be 5 mm. In another example, the first thickness can be 6 mm. In yet another example, the first thickness can be about 7.2 mm or larger. Such the selection of the first thickness 105 provides an important load sustenance characteristic and impact hail resistance characteristic to the concentrator of the solar module, although other factors including the composition profile, stress profile, packaging method etc also contribute to these physical characteristics. For example, in one embodiment, the glass can be replaced by a laminated glass made of polymer which may provide better impact resistance with a same or smaller thickness compared to a conventional solar glass.

According to Industrial Qualification Standards, the solar module should be able to sustain a load of 2400 Pa uniformly applied to the surface of the module for 1 hour in two cycles. Additionally, the solar module should be able to resist a hail impact represented by an ice ball of 25 mm diameter directed at a speed of at least 23 meter per second to 11 (random) locations on a entire surface region of about 1 meter×1.6 meter or bigger. According to certain embodiments, the combination of the selection of those physical dimensions and compositions of the glass concentrator result in a satisfaction of all the Industrial Qualification Standards including the mentioned load test or impact hail test. For example, Industrial Qualification Standards for solar module include IEC 61215, IEC 61730, and UL 1703. Of course, there can be other variations, modifications, and alternatives for these dimension numbers including the first dimension, second dimension, the first thickness, and the peripheral region dimension.

Additionally, as part of a light receiving top cover, the concentrator referred in the FIG. 1 must possess a high transmission and low reflection characteristics. In one embodiment, the concentrator is made of glass having a transparent characteristic with a transmissivity of 90 percent and greater for a visible light range. This high transmissivity is achieved by controlling the composition of the glass to reduce the sunlight absorption to minimum. For example, the iron content of the glass needs to be a trace amount and less. In another example, cerium oxide with a concentration of about a trace amount or less or non-existent. In another embodiment, there will be an anti-reflective coating (not shown in FIG. 1) overlying the top region 101 which is a flat surface. In yet another embodiment, before applying the anti-reflective coating, an infrared blocking coating (not shown in FIG. 1) may be applied overlying the top region 101. This infrared blocking coating allows visible light transmitted through but block the infrared spectrum so as to reduce the heating to the photovoltaic region during the sunlight conversion process. Of course, there can be other variations, modifications, and alternatives.

Figure 2:
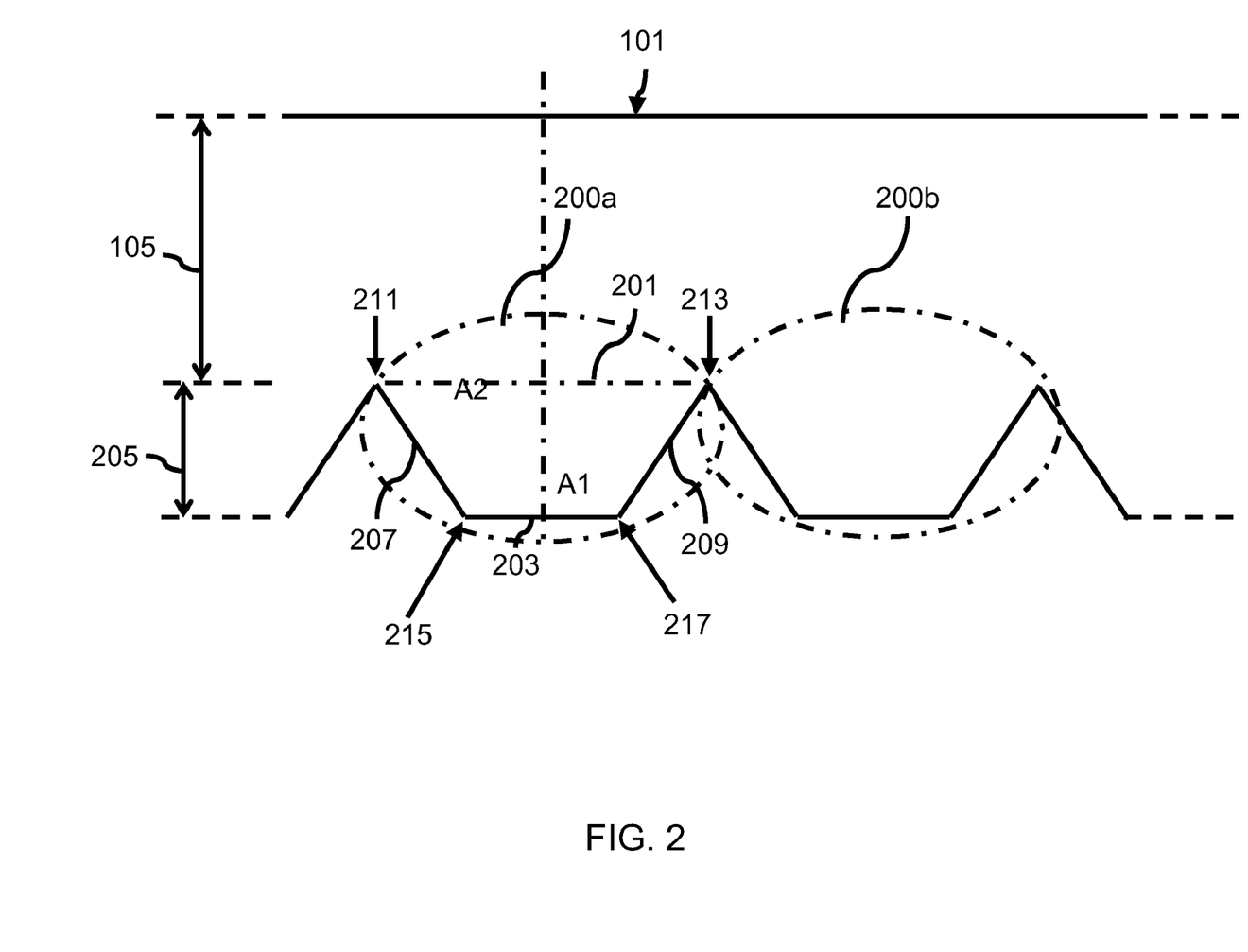
FIG. 2 is a detailed diagram of a glass concentrator with a plurality of elongated concentrating elements according to an embodiment of the present invention.

FIG. 2 is a detailed diagram of a glass concentrator with a plurality of elongated concentrating elements according to an embodiment of the present invention. This diagram is merely an example, which should not unduly limit the scope of the claims herein. One of ordinary skill in the art would recognize other variations, modifications, and alternatives. As shown is a local cross-sectional view of the elongated concentrating elements integrally formed with the back region of the webbing. Each of the concentrating element includes at least the following geometric elements: an aperture region 201, an exit region 203, a first side region 207 provided between a first edge portion 211 of the aperture region and a first edge portion 215 of the exit region, a second side region 209 provided between a second edge portion 213 of the aperture region and a second edge portion 217 of the exit region, and a second thickness 205 measured between the aperture region 201 and the exit region 203. A second edge portion for a first concentrating element 200a coincides with a first edge portion of the neighboring second concentrating element 200b to form an aperture notch. For example, an aperture notch is located at the edge portion 213. In one embodiment, because there is a radius of curvature for each of the aperture notches (not shown in FIG. 2), the true aperture region 201 is subtracted by a small curved vicinity of two neighboring aperture notches at edge portion 211 and 213. Similarly, the exit notch also has a small radius of curvature so that true light exit region should include those curved exit notches. For example, exit region 203 should include two exit notches at edge portion 215 and 217. The aperture region 201 is not an interface but an integral part of the back region 103 of the webbing 100.

For effectively collecting the sunlight, the concentrating element is preferred to possess a geometric optical concentrating characteristic. In a specific embodiment, the aperture region 201 is characterized by a light entrance area A2 and the exit region 203 is characterized by a light exit area A1. In an specific embodiment, the light entrance area A2 includes only the true aperture region excluding a small curved area of the aperture notch. The light exit area A1 should include additional area contributed by the curved exit notches. The light concentrating characteristic is represented by an aperture-to-exit area ratio A2/A1 ranging from about 1.8 to about 4.5. In one embodiment, the aperture-to-exit area ratio is equivalent to a scale ratio as one side of the aperture region 201 has a substantially equal dimension of one side of the exit region 203. In other words, the exit region 203 has a reduced dimension compared to the aperture region 201 and the two side regions 207 and 209 of the concentration elements are tilt inward (relative to vertical direction). Sunlight coming through the aperture region 201 with a relatively wide range of incident angles will be completely reflected at the two side regions because those incident angles (around the normal incident angle) may still be larger than the total reflection angle of the side region interface. In a specific embodiment, the second thickness 205 is selected to be about 1.8 mm and the exit region width is about 2 mm and the aperture region width is about 4.12 mm. In one embodiment, each of the two side regions may be a flat type of interface so that the cross-sectional view of the concentrating element is a trapezoidal shape. In another embodiment, each of the two side regions may be curved type of interface with variable curvature values across the spatial of side regions. In yet another embodiment, the curvature variations of the two side regions may be symmetric. In yet still another embodiment, the curvature variations of the two side regions may be non-symmetric. Of course, there can be other variations, modifications, and alternatives.

In another specific embodiment, this light concentrating characteristic is also represented by high reflectivity of the inner face of the two side regions. Firstly, the high reflectivity is achieved by polishing the glass at the two side regions so that the roughness of the side region is reduced to a value of 30 nm RMS and less. Secondly, certain thin film coating may be applied to enhance the reflectivity. Of course, there can be other variations, modifications, and alternatives.

In yet another specific embodiment, this light concentrating characteristic is further implemented by certain roughening treatment to the exit region to reduce the inner reflection at the exit region to minimum. This treatment may allow most sunlight beams reaching at the exit region be able to transmit through and be received by a photovoltaic strip that may be attached below the exit region in the solar concentrator modules. In one embodiment, the photovoltaic strip can be attached to the exit region using an optical adhesive. For example, the optical adhesive can be an aliphatic polyurethane. In another embodiment, this optical adhesive can be chosen to have an optical refractive index that well matches with the glass concentrating element so that the reflection loss at the interface of exit region would be minimized. The refractive index of the glass concentrator is at least 1.4 or greater. For example, the optical adhesive can be a two part mixture using a aliphatic polyurethane mixture.

In yet still another specific embodiment, the light concentrating characteristic also can be represented by other geometric details such as micro-curvature near the vicinities of the aperture notches 211 and 213 and exit notches 215 and 217. A smaller radius of curvature for the aperture notch helps to increase effective light entrance area. A smaller radius of curvature for the exit region help to reduce the possible loss of light collected from being directed away from the photovoltaic strips. Certain embodiments of the present invention include a method of making the glass concentrator with minimized notch radius of curvature for each of the plurality of concentrating elements. For example, the radius of curvature for the notches of the concentrating element is about 0.1 mm or less. With a reduced notch radius of curvature, the light concentrating efficiency is improved. Of course, there can be other variations, modifications, and alternatives. All these physical, mechanical, and optical properties of the concentrating element cumulatively contribute the performance of the light concentrating function for manufacture of an efficient and cost-effective solar conversion module according to certain embodiments of the present invention.

Further detail of various methods according to embodiments of the present invention on making the glass concentrator and assembling a solar concentrator module are provided throughout the present specification and more particularly below.

According to a specific embodiment, a method for making the glass concentrator for manufacture of solar conversion module can be outlined as follows:
1. Forming a ribbon glass in a floating bath with a rectangular shape and a first thickness between a front surface and a back surface;
2. Rolling with a shaped molding roller across the front surface partially into the first thickness to form a plurality of shaped structures;
3. Annealing the ribbon glass;
4. Rolling the back surface while transporting the ribbon glass;
5. Polishing at least partially each of the plurality of shaped structures.

These sequences of processes provide a way of performing a method according to an embodiment of the present invention. As shown, embodiments of the present invention provides a easy way of integrally making the glass webbing with a plurality of elongated concentrating elements possessing necessary light concentration function while at the same time bearing other characteristics required for an efficient solar energy conversion module that meets all industrial qualification standards. The method can be implemented based on established conventional floating glass manufacturing technology. The flame polishing treatment also provides a low cost high quality process for achieving the required small roughness for certain portion of the concentrating elements. Of course, there can be variations, modifications, and alternatives. Some processes can be performed in different order. Some processes can be removed or added. For example, when using plastic material to replace glass, some process may be modified to use direct molding to form the elongated concentrating elements. Alternative polishing processes may also be utilized to achieve required roughness and minimized notch radius. These and other details of the present method can be found throughout the present specification and more particularly below.

Figure 3:
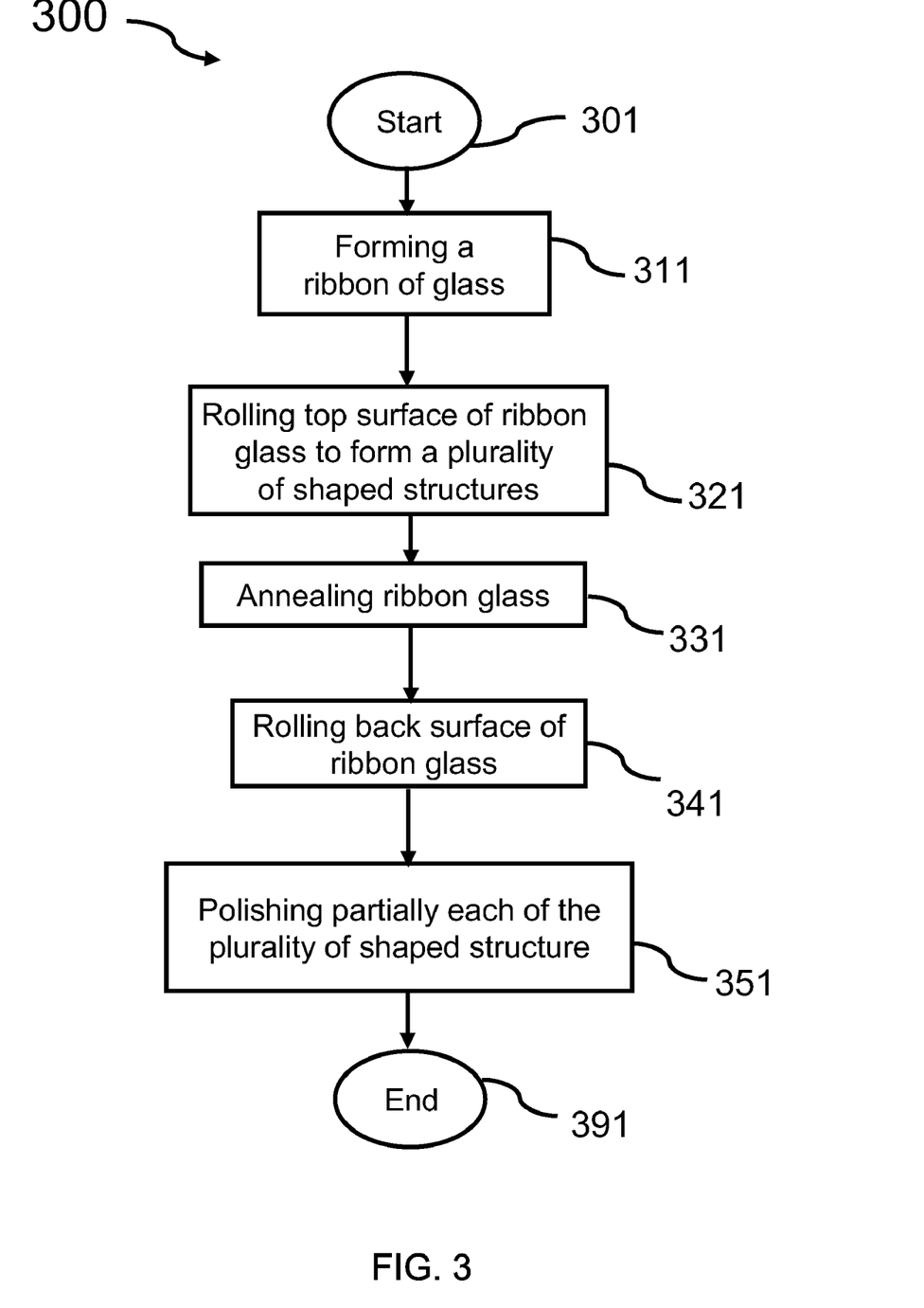
FIG. 3 is simplified diagram illustrating a method of making a glass concentrator according to an embodiment of the present invention.

FIG. 3 is simplified diagram illustrating a method 300 of making a glass concentrator according to an embodiment of the present invention. This diagram is merely an example, which should not unduly limit the scope of the claims herein. One of ordinary skill in the art would recognize other variations, modifications, and alternatives. As shown, the method 300 includes forming a ribbon glass (process 311) in a floating bath with a rectangular shape and a first thickness between a top surface and a back surface. In one embodiment, a group of batch materials including sand, limestone, cerium oxide, iron oxide and salt cake are collected, then melted and blended in a furnace. In another embodiment, the molten glass is made from polymer. The resulting product is a molten glass with controlled compositions of certain materials that bears the required physical characteristics including photon absorption, mechanical strength, stress distribution, or refractive index value etc. Of course, there can be other variations, modifications, and alternatives.

Depending on the embodiment, the method 300 may include feeding a predetermined amount of the molten glass or semi-fluid polymer into a floating bath. The floating bath typically can be made of tin with polished surface at its bottom and peripheral sides having a desired rectangular dimensions and a depth. For example, the rectangular dimensions are substantially the same as the first dimension or the second dimension of the webbing mentioned earlier in this specification. In a specific embodiment, the floating bath is provided with a protective atmosphere consisting of a mixture of nitrogen and hydrogen to prevent oxidation of the tin. As being feed in the floating bath, the molten glass spreads to entire bath spatially due to the gravity and surface tension.

Depending on the embodiment, the method 300 may include processing the ribbon glass to have a first thickness even for entire ribbon glass between a top surface and a back surface. For example the processing involves to control the temperature of the floating glass so that it can spread to entire bath due to the gravity and proper surface tension. In another example, the processing includes rolling the top surface to speed up the spreading or stretching of the floating glass. According to certain embodiments, the first thickness is necessary for possessing sufficient load sustenance and impact hail resistance characteristics for the resulting glass webbing to be used for manufacture of a solar concentrating module. For example, the first thickness is at least 5 mm. In another example, the first thickness is about 8 to 9 mm. The processing the ribbon glass also includes annealing the ribbon glass and cooling it to a desired temperature for a molding process.

Additionally, the method 300 includes rolling (process 321) with a shaped molding roller across the front surface partially into the first thickness to form a plurality of shaped structured with a second thickness. The molding roller is at least longer than one dimension of the ribbon glass in rectangular shape. The rolling process may be performed after the formation of ribbon glass with the even first thickness and the temperature of the subject ribbon glass is cooled to a predetermined first temperature. Depending upon the embodiment, the method may includes lowering a shaped molding roller with a elongated body and a predefined cross-sectional shape, aligning the roller in parallel with one side of the rectangular-shaped ribbon glass, rolling the roller across the top surface partially into the first thickness of the ribbon glass, then re-lifting away from the top surface within a first time period. In a specific embodiment, the lowering and rolling of the molding roller is controlled to generate a second thickness for the plurality of shaped structures during the rolling process. In another specific embodiment, the rolling process comprises a cooling procedure that uses a cooling system following after the roller. The cooling system provides a localized cooling for the just-formed structures on the top surface. For example, the cooling system may spray a pulse of cold water or cryogenic non-reactive gas locally. The localized cooling helps to partially fix the shaped structures formed from the rolling process. In a preferred embodiment, the plurality of shaped structures on the top surface are a series of elongated elements substantially identical to each other. Each of the elongated elements comprises an optical concentrating geometry characterized by two side surfaces and a scale ratio of an aperture region to an exit region larger than at least 2.0. The plurality of shaped concentrating elements are formed one-next-to-another with a second thickness on the top surface of the ribbon glass. In another preferred embodiment, the second thickness formed by the rolling process for each concentrating element is about 1.8 mm. The remaining portion of the ribbon glass belongs to the webbing.

Moreover, the method 300 includes annealing the ribbon glass (process 331) to gradually cool the entire ribbon glass. Right after a concentrating element is formed, a localized cooling is applied for partially fix the shape of the concentrating element. During that procedure, the temperature of the ribbon glass may be cooled locally from the first temperature to a second temperature via conduction and convention. After the rolling process, the entire ribbon glass may be further annealed using another cooling system. The annealing process is controlled to cool the ribbon glass from the second temperature from a third temperature within a second time period. Depending on the embodiment, the annealing process helps to reduce the stress within the ribbon glass and improve the load sustenance and impact resistance of the resulting glass webbing.

As the ribbon glass is sufficiently cooled, the method 300 may include lifting the ribbon glass out of the floating bath and transfer to a plurality of circular rollers coupling with the back surface. The ribbon glass can be transported in the process 341 along the roller pathway to a polishing treatment stage. Then the process 351 can be executed using an elongated burner that is burning with hydrogen and oxygen gas mixture with a predetermined mixing ratio. The elongated burner with a flame is directed to the top surface containing the plurality of elongated concentrating elements formed in the rolling process (321). The orientation of the burner is substantially aligned with each of the plurality of formed concentrating elements. Particularly, the burner is configured to generate flames with a narrow, nearly one-dimensional shape so that relatively small region of the concentrating element can be treated with better control. For example, the formed concentrating element is the elongated concentrating element 200 that has two side surfaces 207 and 209. The flame polishing treatment is controlled to apply only on the side surfaces 207 and 209 but not on the exit region. In one embodiment, each side surface is treated at a time while the burner is directed sequentially from one side surface to another and from one concentrating element to next. In another embodiment, the flame treatment may also be used to adjust radius of the exit notches 215 and 217 etc. or reduce the radius of curvature of the aperture notches 211 and 213 etc. In yet another embodiment, the flame on/off, flame temperature, flame polish time, queue time, and other process parameters can be controlled by a controller linked with a computer so that the desired roughness of the two side regions or desired exit radius can be achieved. For example, as low as 30 nm RMS and less for two side regions is preferred. Of course, there can be many other variations, modifications, and alternatives.

The method 300 also includes rolling the back surface (process 341) while annealing and transporting the ribbon glass. Before and after the flame polishing process, the ribbon glass can be rolled on its back surface by a plurality of rollers. The rolling serves to flattening the back surface while transporting the subject glass during which the glass continues to be annealed to room temperature.

Although the method 300 has been specifically shown by those process steps mentioned in above paragraphs, there can be many other variations, modifications, and alternatives. Some of the processes may be removed or be performed in different order. Other processes may be added or used to replace some of above processes. For example, the rolling process using a shaped molding roller for forming the concentrating elements may be replaced by using a shaped cast molding directed into the second thickness into the ribbon glass with a first thickness. Alternatively, an etching process may be used for forming the plurality of concentrating elements. In another example, the flame polishing process may be replaced by an acid polishing or a mechanical process. In yet another example, plastic material can be used to replace glass for the concentrator. Fixed molding can be used instead of roller and other polishing techniques such as vapor polishing and mechanical polishing may be used in addition to the flame polishing. Additionally, one or more post-deposition processes may be performed to overlay infrared blocking coating on the back surface (which will become the front region for the solar module) when the ribbon glass is transferred to a deposition chamber. Furthermore, an anti-reflective coating may be deposited overlying the infrared blocking coating. The side regions of the concentrating elements can also be deposited with a reflectivity enhancement coating.

Figure 4:
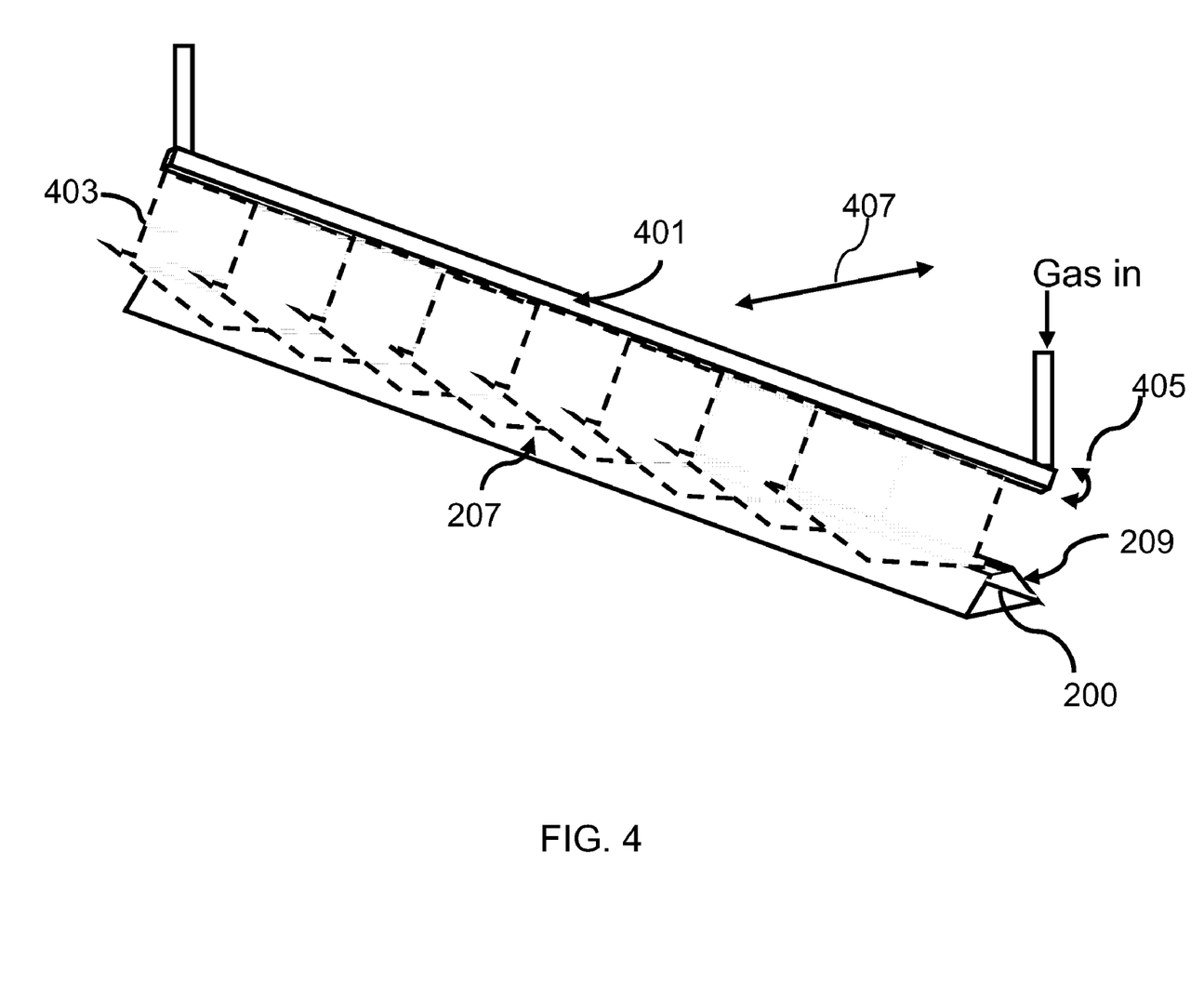
FIG. 4 is a simplified diagram illustrating a concentrating element with an exit region in reduced width and two side regions being flame polishing treated according to an embodiment of the present invention.

FIG. 4 is a simplified diagram illustrating a concentrating element with an exit region in reduced width and two side regions being flame polishing treated according to an embodiment of the present invention. This diagram is merely an example, which should not unduly limit the scope of the claims herein. One of ordinary skill in the art would recognize other variations, modifications, and alternatives. As shown, one elongated concentrating element 200 has a side region 207 and another side region 209. An elongated burner 401 having substantially similar length as the concentrating element 200 is aligned in substantially the same orientation. The burner 401 is configured to have a plurality of gas nozzles (not shown directly in FIG. 4). Hydrogen/oxygen gas mixture is supplied though a build-in tubing in the burner holder. As ignited, the plurality of gas nozzles is capable of generating a nearly one-dimensional flame 403. In one embodiment, the gas mixing ratio is predetermined to generate a desired heat transfer profile along the axial direction of the flame. The burner 401 with the flame 403 is directed to the vicinity of the concentrating element 200 at a predetermined variable distance. The flame 403 touches the side region 207 to perform the polishing treatment. In another embodiment, the burner 401 is configured to rotate in certain range of angles 405 so that it can be guided to the one side region at a proper angle at one time and then be guided with a proper angle to the next side region at another time. In yet another embodiment, the burner 401 can be laterally transported in direction 407 to allow the polishing treatment being performed from one concentrating element to another. In certain embodiments, multiple burners that are similar to the burner 401 can be implemented at the same time to speed up the treatment for all the concentrating elements on the whole concentrator. Of course, depending upon the embodiment, there can be many other variations, modifications, and alternatives.

Figure 5:
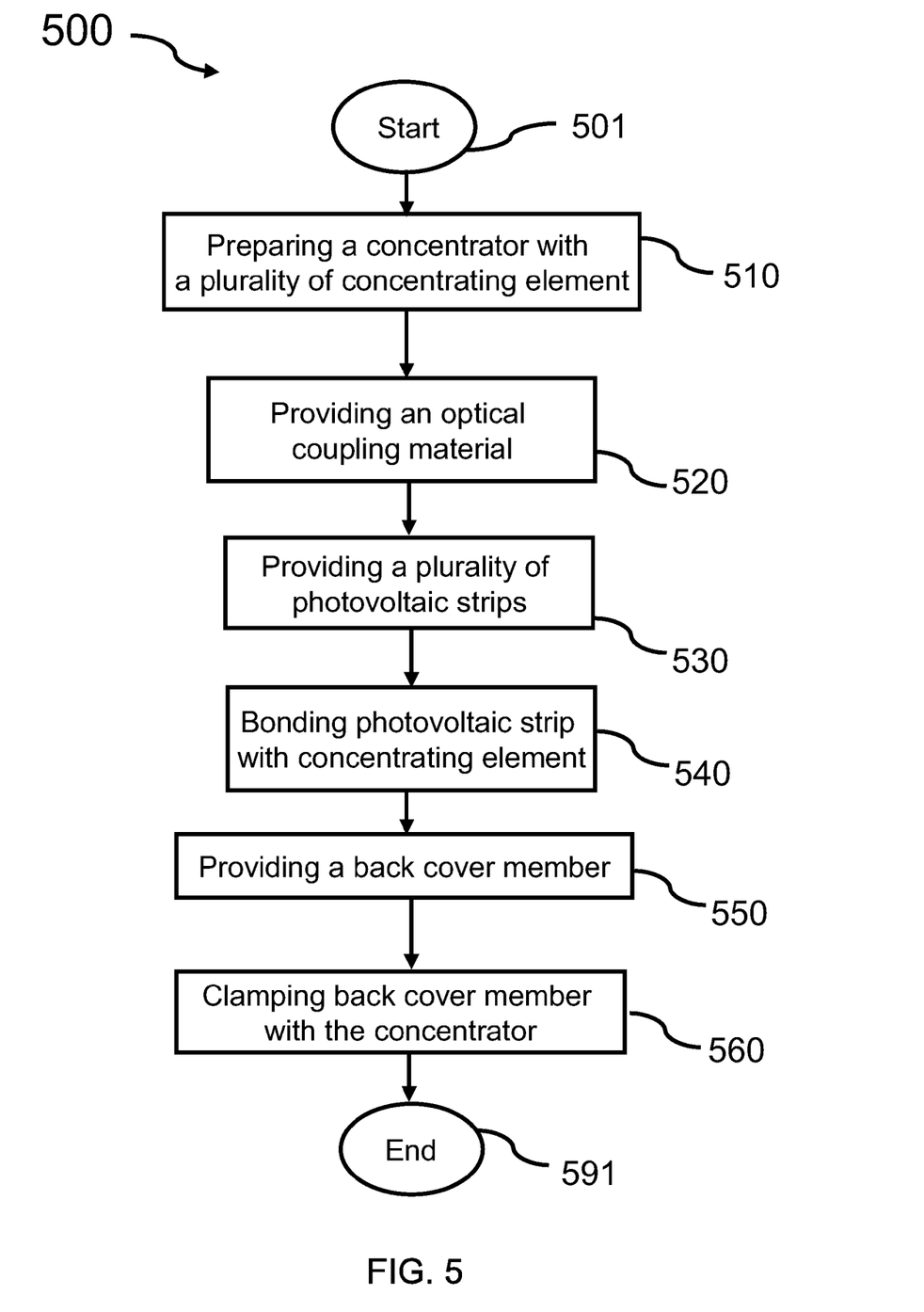
FIG. 5 is a simplified diagram illustrating a method of assembling a solar concentrator module according to an embodiment of the present invention.

In an alternative embodiment, the invention provides a method for assembling a solar concentrating module as illustrated by FIG. 5. Preferably, the method can be implemented using the glass concentrator made according to certain embodiments of the present invention. A method 500 according to an embodiment of the present invention can be outlined as follows:
1. Process 510: preparing a concentrator comprising a webbing with a plurality of elongated concentrating elements having light-collecting exit regions;
2. Process 520: providing an optical coupling material overlaying the light-collecting exit regions;
3. Process 530: providing a plurality of photovoltaic strips;
4. Process 540: bonding the plurality of photovoltaic strips using at least the optical coupling material to the light-collecting exit regions;
5. Process 550: providing a back cover member, wherein the back cover member can be rigid or flexible;
6. Process 560: clamping the back cover member with the webbing;
7. Process 570: performing other steps, as desired.

These sequences of processes provide a way of performing a method according to an embodiment of the present invention. As can be seen, the method provides a technique for assembling a solar concentrator module using the concentrator made according to another embodiment of the invention. Of course, there can be variations, modifications, and alternatives. Some processes can be performed in different order. Some processes can be removed or added. For example, clamping a rigid back member with the planar webbing of the glass concentrator is performed differently from clamping a flexible backsheet with the webbing. After the clamping the back cover member with the webbing, a sealing process may be performed. In another example, the clamped package comprising hollow space between the photovoltaic strips and the back cover member will not be sealed, instead, air or other vapor is allowed to breath in/out. Further details of the present method and resulting structures can be found throughout the present specification and more particularly below.

Figure 6:
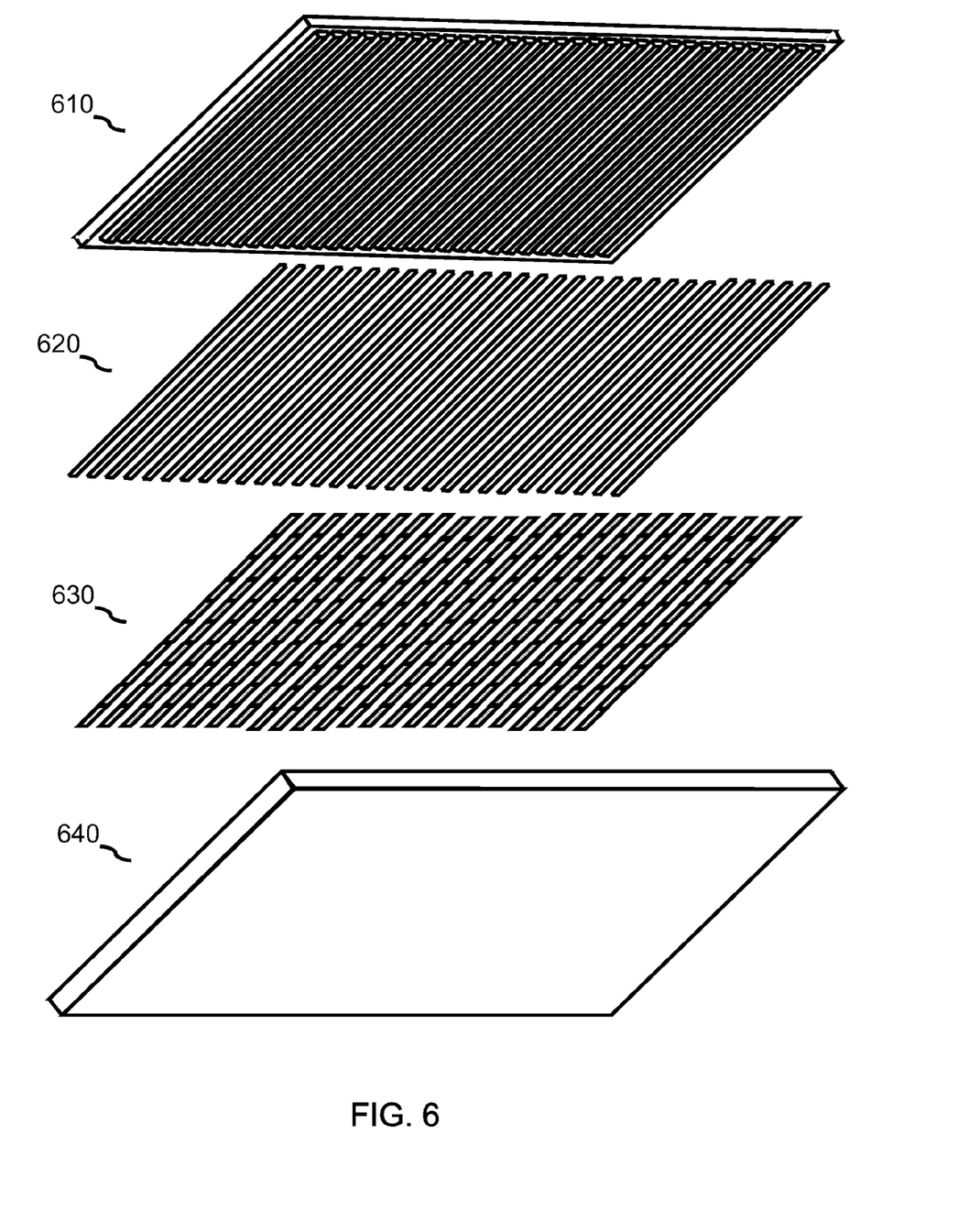
FIG. 6 is a simplified diagram illustrating an expanded view of a solar concentrator module assembly according to an embodiment of the present invention.

Referring now to FIG. 6, an expanded view of a solar concentrator module assembly according to an embodiment of the present invention is illustrated. This diagram is merely an example, which should not unduly limit the scope of the claims herein. One of ordinary skill in the art would recognize other variations, modifications, and alternatives. As shown in FIG. 6, a solar concentrator module includes various elements. The module has a glass concentrator 610, which is a planar webbing including a front region, a back region, a shape characterized by a first dimension and a second dimension, and a first thickness provided between the front region and the back region. The front region is a flat surface which is also a top surface of the module for receiving the sunlight. The back region integrally includes a plurality of elongated concentrating elements. Each of the elongated concentrating elements includes a light-collecting exit region. For example, the glass concentrator 610 is a planar webbing glass with shaped concentrating elements made from the method of 300 referred in FIG. 3. In one example, the planar webbing has a planar region comprising a rectangular shaped panel with the first dimension about 1 meter or bigger and a second dimension about 1.6 meter or bigger. As an example, for assembling a solar concentrator module, the glass concentrator 610 may be prepared by the process 510.

In a preferred embodiment, the plurality of elongated concentrating elements is characterized by a geometric optical concentrating function. In one embodiment, the concentrating function is represented by an elongated exit region with a reduced dimension versus a light entrance area corresponding to each concentrating element. Each of the elongated concentrating elements joins with one or two neighboring element to form an aperture notch. An aperture notch with minimized radius of curvature helps to maximize the true size of aperture region, i.e., the light entrance area. In another embodiment, the concentrating function is represented by the two highly reflective side regions for each of the elongated concentrating element that help to direct light coming in the aperture region to the exit region with minimum loss. In another preferred embodiment, the exit region is a second distance away from the back region of the planar webbing. The plurality of elongated concentrating elements cumulatively occupies the entire back region except a peripheral region surrounding the planar webbing.

An optical coupling material 620 is provided overlaying the spatial area of the exit region for each and every elongated concentrating elements. The optical coupling material will be used for bonding the concentrating element with the solar energy conversion unit. For example, the optical coupling material is aliphatic polyurethane. In a preferred embodiment, the optical coupling material has a refractive index of about 1.4 or greater that is well matched with the glass concentrator used for this assembly. The matching of the refractive index will ensure minimum loss of the collected light beam from being reflected from the interface between the exit region and the coupling material. Additionally, the coupling material is desired to have a suitable Young's Modulus and a thermal expansion coefficient so that the coupling material can withstand for changes due to thermal expansion of both the glass element and photovoltaic strip element. For example, the optical coupling material is a aliphatic polyurethane, but can be others. As an example, the optical coupling material 620 is provided in process 520.

Referring to FIG. 6 again, the solar concentrator module further includes a plurality of photovoltaic strips 630. These photovoltaic strips are formed on a semiconductor substrate and are cut into a strip shape defined by two short sides with a strip width and two long edges with a strip length. In one embodiment, the strip width is about 2 mm which is substantially the same as a preferred width of the exit region. The strip length is about 6 inches. Each of the photovoltaic strips includes a plurality of p-type regions and a plurality of n-type regions. Each of the p-type regions is coupled to at least one of the n-type regions to form a p-n junction unit capable of converting photo energy to electricity. For example, the photovoltaic strips are made of at least one material selected from single crystal silicon, polycrystalline silicon, amorphous silicon, copper indium diselenide (CIS), Copper Indium Gallium Selenide (CIGS), Cadmium Telluride (CdTe), thin film materials, or nanostructured materials. Of course, there can be other variations, modifications, and alternatives. As an example, the plurality of photovoltaic strips is provided in process 530.

As an example, the solar concentrating module includes a plurality of photovoltaic strips spatially disposed in a parallel manner overlaying the exit regions of the elongated concentrating elements. Each of the photovoltaic strips is operably bounded with at least a portion of one exit region by the optical coupling material 620. In one embodiment, the length of an exit region of the concentrating element is about 1 meter or bigger. Multiple photovoltaic strips are required to attach with the exit region one following another and cumulatively covers all spatial area of the exit region. Similarly, a plurality of photovoltaic strips are attached with each and every exit region of the plurality of concentrating elements. Of course, there can be other variations, modifications, and alternatives. As an example, the plurality of photovoltaic strips are bounded with corresponding concentrating elements in process 540.

In a preferred embodiment, each of the photovoltaic strips comprises a plurality of electric leads located on two long edges. Each of the plurality of electric leads is coupled to each other through thin conductive wires. Additionally, conductive means including but not limiting bus bars are used for coupling the neighboring photovoltaic strips. These electric leads and conductive means are configured to link to an electric circuit for providing electric power that is generated from the sunlight by p-n junction units in the plurality of photovoltaic strips. Of course, there can be other variations, modifications, and alternatives.

Further referring to FIG. 6, the solar concentrator module also includes a rigid back cover member 640. The back cover member includes a planar region comprising a electric circuit board and a peripheral uprising edge wall. The electric circuit board is configured for coupling with the plurality of electric leads on each of the plurality of photovoltaic strips and providing power management for module electric power output. The edge wall of the back cover member is configured to be easily clamped with the webbing of the concentrator at the peripheral region. The edge wall has a properly selected height that is substantially suit for enclosing the entire rest parts of the module including the glass concentrator, the photovoltaic strips, circuit board and all coupling materials in between. In one embodiment, the back cover member 640 is characterized by an anodized aluminum bearing material. In another embodiment, the back cover member 640 is made of plastic material. In yet another embodiment, the back cover member has a surface feature configured to provide efficient heat dissipation. For example, a plurality of fins may be formed on the outer surface of the back cover member. Of course, there can be other variations, modifications, and alternatives on the material selection and mechanical design for the back cover member. For example, the back cover member 640 is provided in process 550.

In a preferred embodiment, the back cover member 640 is clamped with the glass webbing of the concentrator 610. The glass webbing of the concentrator 610 has an about 10 mm peripheral region being left out without the concentrating elements and intentionally designed for the module packaging purpose. In one embodiment, the clamping can be done based on mechanical mechanism using clips or screws etc. In another embodiment, the clamping is performed by welding the back cover member and an encapsulating frame of the glass together. The edge wall of the back cover member is specifically designed to match with the peripheral region of the glass webbing. In another embodiment, the clamping between the back cover member and the rest of module is done by a glue-bonding mechanism. Depending on the embodiment, the resulting solar module from any clamping mechanism contributes effectively to many characteristics related to load sustenance, impact resistance, and ability to withstand environmental stress or aging. Of course, there can be other variations, modifications, and alternatives. As an example, the clamping of the back cover member 640 to the webbing is performed at process 560. Of course, there can be other variations, modifications, and alternatives.

In an alternative embodiment, the uprising surrounding wall of the back cover member has a height more than that required for enclosing all the rest components of the solar concentrator module so that there are some spatial region between the photovoltaic strips and the back cover member. In one embodiment, after the clamping process, a sealing process may be performed to add vacuum-tight encapsulate material around the clamping joint. The sealing encapsulate material is selected based on module qualification test requirement imposed for the solar module. The qualification tests include damp heat test, humidity freeze test, thermal cycling test, UV or hot-spot tests or other aging tests. The vacuum sealed packaging may have advantage to perform better to reduce certain types of damage related to moisture dropped onto the photovoltaic strips. In another embodiment, the clamped package is intentionally left some micro passage ways to allow breathing, i.e., during day time the heated spatial region between the photovoltaic strips and the back cover member can drive out the absorbed moisture inside the module. Of course, there can be other variations, modifications, and alternatives.

Figure 7:
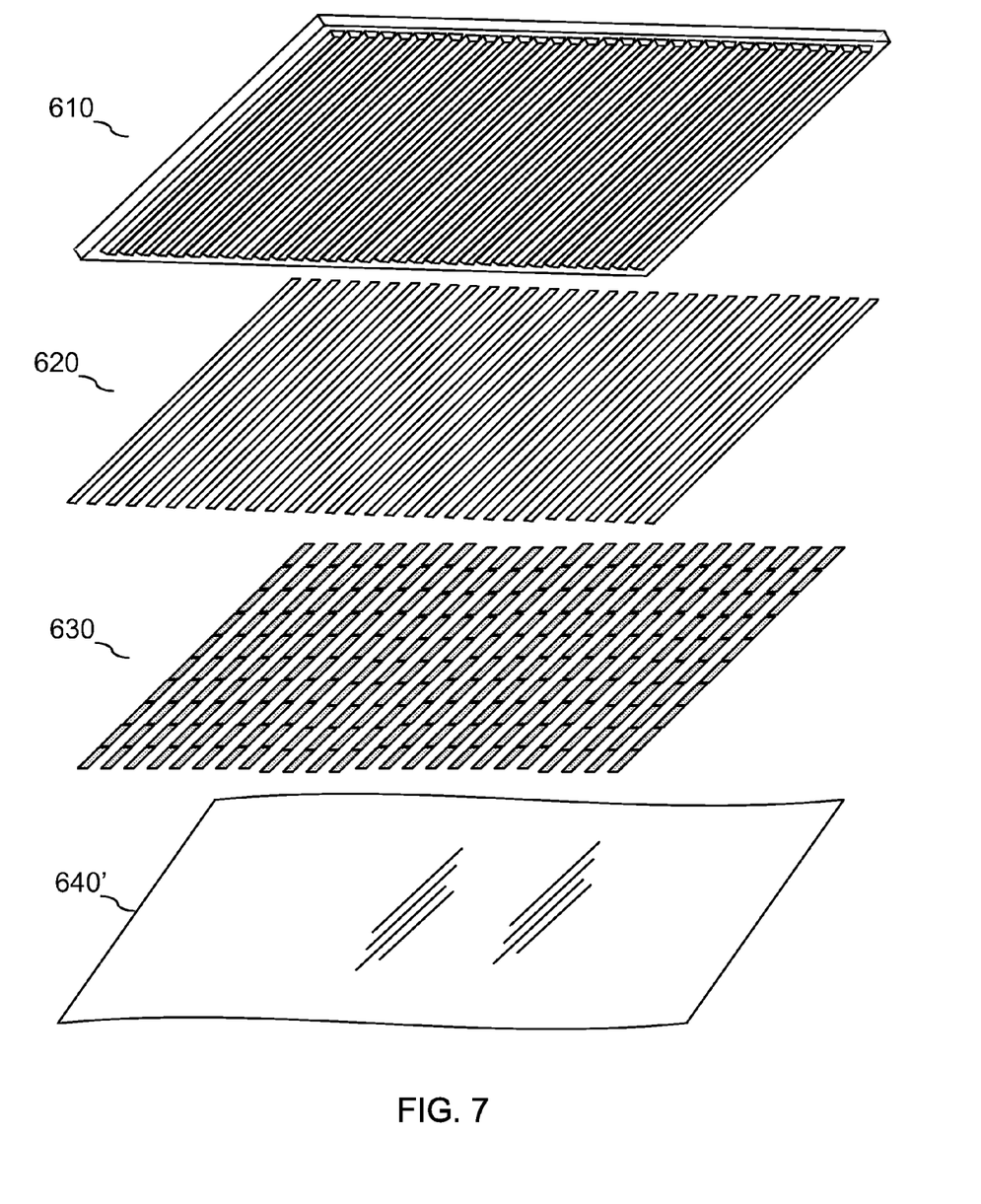
FIG. 7 is a simplified diagram illustrating an expanded view of a solar concentrator module assembly according to an alternative embodiment of the present invention.

In an alternative embodiment, referring to FIG. 7, the solar concentrator module includes all components mentioned earlier except that the rigid back cover member can be replaced by a flexible backsheet 640'. FIG. 7 is just an exemplary illustrating of such solar concentrator module including the flexible backsheet. The flexible backsheet is configured to adapt the surface corrugation after attaching the plurality of photovoltaic strips to the concentrator elements. Additionally, the flexible backsheet, according to certain embodiments of the invention, still is capable of providing the necessary mechanical support and environmental protection for the solar concentrator module. In one embodiment, the flexible backsheet 640' is also provided in process 550 and is clamped with the glass concentrator 610 in process 560.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A solar concentrator module for manufacture of solar energy conversion system, the sunlight concentrator module comprising:
    a webbing configured from a thickness of material and having a shape characterized by a first dimension, a second dimension, a planar region defined by the first dimension and the second dimension, the webbing having a front region, a back region, and a first thickness of at least 3.2 millimeters up to 7.2 millimeters provided between the front region and the back region;
    a load sustenance characteristic provided by the first thickness of the webbing, the load being at least of 2400 Pa uniformly applied on the front region for 1 hour in two cycles;
    a hail impact resistance characteristic of the webbing with the first thickness, the impact hail being an ice ball with at least of 25 mm diameter directed at a speed of at least 23 meter per second to at least 11 locations of the front region;

a plurality of concentrator elements integrally formed with the back region excluding a peripheral region of the webbing, each of the concentrator elements being disposed one-next-to-another in parallel along the first dimension and characterized by a length, an aperture region, an exit region, a first side region provided between a first portion of the aperture region and a first portion of the exit region, a second side region provided between a second portion of the aperture region and a second portion of the exit region, and a second thickness of about 1.8 millimeters provided between the aperture region and the exit region, the length being substantially the same as the second dimension;

a geometric concentration characteristic provided by a scale ratio of the aperture region to the exit region for each of the plurality of concentrator elements, the scale ratio being characterized by a range from about 1.8 to about 4.5;

an optical transparency characteristic of the first thickness of the webbing combined with the second thickness of each of the plurality of concentrating elements with a transmissivity being at least of 90% and greater within a visible light range;

a plurality of photo voltaic strips, each of the plurality of photo voltaic strips coupled to at least a portion of each of the exit region of the plurality of concentrator elements, each photovoltaic strip having a width substantially similar to the exit region, one or more photovoltaic strips having a cumulative length substantially similar to the length of the concentrator element, each of the photovoltaic strips comprising a silicon material;

a plurality of electric conducting leads disposed along two edges of each of the plurality of photo voltaic strips, each conducting lead being conductively connected to each other and to module external electrical ports; and a rigid back cover member having substantially the same shape of the webbing and being configured to mechanically couple with the webbing; and wherein the first side region and the second side region are characterized by a root-mean-square (RMS) roughness of 30 nm and less and the first side region and the second side region expose respective portions of the thickness of material; and wherein the thickness of material comprises the first thickness and the second thickness.

2. The solar concentrator module of claim 1 wherein the planar region comprises a rectangular shaped panel with the first dimension about 1 meter or bigger and a second dimension about 1.6 meter or bigger; wherein the back cover is rigid and is coupled to a peripheral region of the webbing.

3. The solar concentrator module of claim 1 wherein the webbing and the plurality of concentrator elements comprise iron element of about a trace amount and less and cerium oxide at a concentration of about a trace amount and less.

4. The solar concentrator module of claim 3 wherein the webbing and the plurality of concentrator elements comprises a single piece of transparent solid with a refractive index of 1.4 and greater made of a laminated glass, or a tempered glass, or a plastic.

5. The solar concentrator module of claim 1 wherein of the webbing further comprises:
    an infrared blocking coating overlying the front region;
    an anti-reflective coating overlying the infrared blocking coating;
    a reflectivity enhancement coating overlying the first side region and the second side region of each of the plurality of glass concentrator.

6. The solar concentrator module of claim 1 wherein each of the plurality of glass concentrator has a concentrating element joining with one of two neighboring concentrating element to form a notch having a radius of curvature of about 0.2 mm and less.

7. The solar concentrator module of claim 1 wherein the aperture region has a width of at least two times larger than a width of the exit region.

8. The solar concentrator module of claim 1 wherein the plurality of photo voltaic strips are made of at least one material selected from single crystal silicon, polycrystalline silicon, amorphous silicon, copper indium diselenide (CIS), Copper Indium Gallium Selenide (CIGS), Cadmium Telluride (CdTe), thin film materials, or nanostructured materials.

9. The solar concentrator module of claim 1 further comprising an optical coupling material characterized by a refractive index matched with the glass concentrator element and a thermal expansion coefficient suitable to mediate the glass concentrator and photovoltaic strip.

10. The solar concentrator module of claim 9 wherein the optical coupling material is an aliphatic polyurethane.

11. The solar concentration module of claim 1 wherein the back cover member comprises an electrical circuit board linked to each of the plurality of photovoltaic strips for power processing.

* * * * *